United States Patent [19]

Greene

[11] Patent Number: 4,518,879

[45] Date of Patent: May 21, 1985

[54] STABLE RAIL SENSE AMPLIFIER IN CMOS MEMORIES

[75] Inventor: Richard M. Greene, Ambler, Pa.

[73] Assignee: Solid State Scientific, Inc., Willow Grove, Pa.

[21] Appl. No.: 528,096

[22] Filed: Aug. 31, 1983

[51] Int. Cl.³ .................. H03K 5/19; G11C 7/06; G01R 19/165; H03F 3/18

[52] U.S. Cl. .................... 307/530; 307/475; 330/277; 365/189

[58] Field of Search .......... 307/350, 362, 530, 475; 365/94, 103, 104, 181, 189, 206, 207, 208; 330/277

[56] References Cited

U.S. PATENT DOCUMENTS

| | | | |
|---|---|---|---|
| 3,560,765 | 2/1971 | Kubinec | 307/530 X |
| 4,103,190 | 7/1978 | Beutler | 307/362 |
| 4,287,570 | 9/1981 | Stark | 307/530 X |
| 4,348,601 | 9/1982 | Kitamura | 307/530 |
| 4,443,718 | 4/1984 | Hagiwara et al. | 307/530 |

FOREIGN PATENT DOCUMENTS 0060078 9/1982 European Pat. Off. ............ 365/103

OTHER PUBLICATIONS

Schanzer, "Read Voltage Supply for MNOS Memory Arrays;" RCA Technical Notes; TN No. : 1233, 10/26/79.

Primary Examiner—Larry N. Anagnos

[57] ABSTRACT

A stable sense rail amplifier for CMOS memories is provided allowing very small voltage swings at or very close to the power supply rail to be transformed into substantially rail-to-rail swings. The input of the amplifier is coupled to the output of memory cells which may be designed to have output swings of 200 millivolts or less. These output swings are shifted to approximately the center of the range between the supply voltage and ground. While the level shifting is performed a small amount of linear gain is added. Subsequently the shifted signal is applied to a linear high gain amplifier stage. The high gain amplifier has as its output a substantially rail-to-rail signal. The total delay from the input rail of the amplifier to the high gain inverting amplifier stage is limited to the transfer time of a single CMOS FET. The amplifier is self-biasing and self-referencing.

9 Claims, 1 Drawing Figure

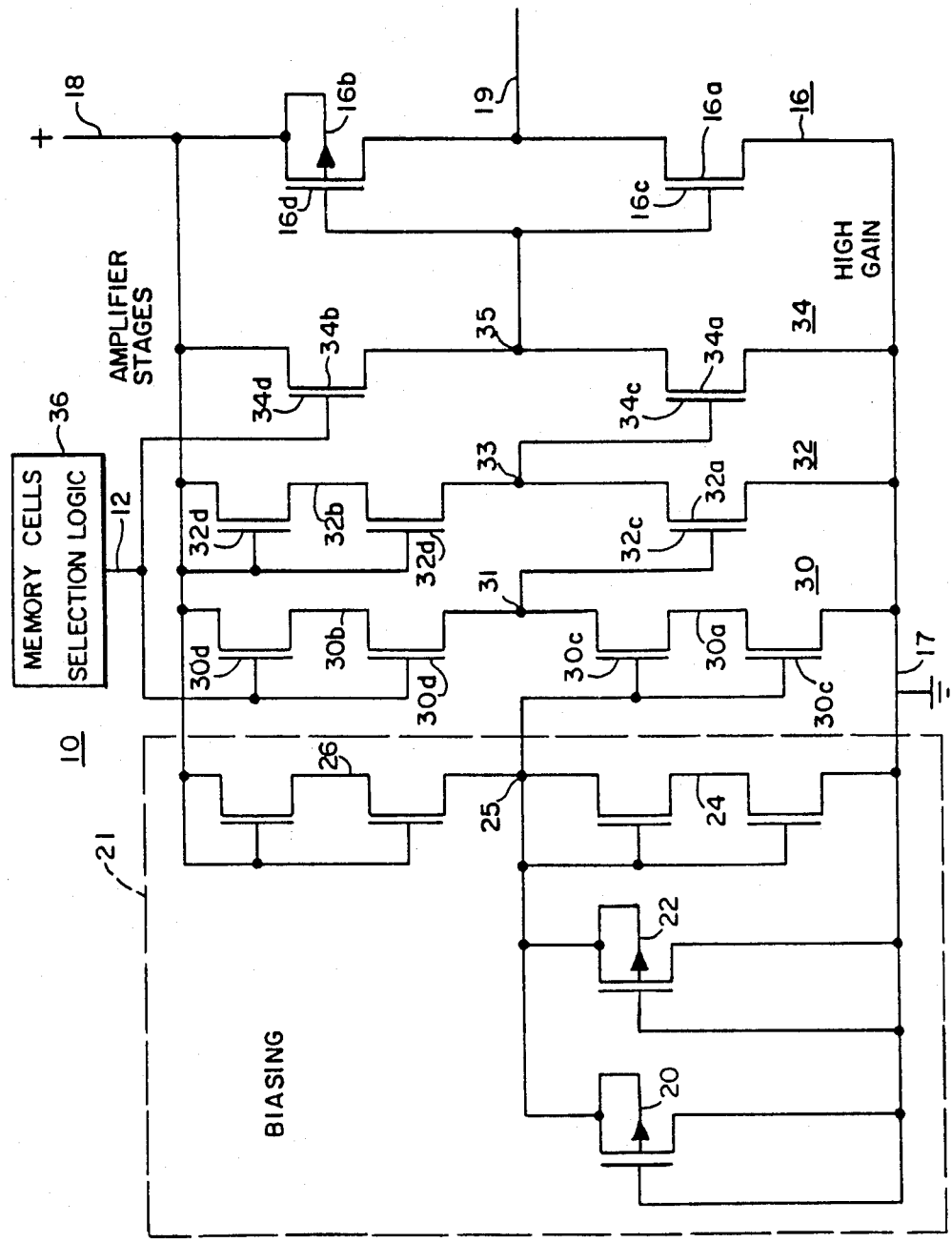

000
STABLE RAIL SENSE AMPLIFIER IN CMOS MEMORIES

BACKGROUND OF THE INVENTION

1. Field of the Invention

This invention relates to the field of art of circuitry for sensing the output of memory cells in CMOS memories. Specifically, the circuit of this invention relates to sensing either a high or a low output from a memory cell, performing level shifting and linear amplification, and transferring the information in the memory cell to other circuits for communication to external pins.

2. BACKGROUND ART

When a CMOS memory cell is accessed the output, either a high voltage level or a low voltage level, will be sensed and this information will be transferred to an external pin. The larger the swing between this high level and this low level, the more reliably it can be determined whether a one or a zero was stored in that cell. However, larger swings require more time and cause a greater power dissipation due to the higher charge flow.

CMOS memories contain supply rails which distribute the supply voltage throughtout the chip. The difference in voltage levels between a one and a zero stored in a memory cell is seen as a swing from the voltage supply rail. Thus, the closer to the voltage of the supply rail that a sense amplifier can operate, the faster the memory circuit can be.

It is thus the object of this invention to sense extremely small voltage swings substantially at or very close to the voltage supply rail, level shift it to approximately one-half of the rail voltage, and perform linear amplification upon this signal.

SUMMARY OF THE INVENTION

A stable rail sense amplifier for CMOS memories is provided allowing very small voltage swings substantially at or very close to the power supply rail to be transformed into rail-to-rail signals. The small voltage swings are shifted to approximately the center of the range between the supply voltage rail and the ground rail and amplified by approximately a factor of two. This shifted signal is subsequently applied to an inverting high gain amplifier. The amplifier circuit of this invention is self-biasing and self-referencing.

BRIEF DESCRIPTION OF THE DRAWING

The drawing is a circuit diagram illustrating the stable sense rail amplifier of the present invention.

DETAILED DESCRIPTION OF THE INVENTION

As illustrated in the drawing, stable rail sense amplifier 10 senses the output of CMOS memory cells and selection logic 36 by way of input rail 12. A memory circuit contains several memory circuits, one of which is selected by the selection logic for application to input rail 12. The selection logic is controlled by voltage levels on pins which are external to the circuit shown in the drawing.

Amplifier 10 has a voltage supply rail 18, ground rail 17, and output runner 19. Voltage supply rail 18 is $V_{DD}$ and the ground rail is $V_{SS}$. Selection logic allows the external pins of the memory circuit to be used to access desired information bits. Output runner 19 is used to couple the output of stable rail sense amplifier 10 to additional amplifier circuits, driver circuits or logic circuits as desired.

Amplifier 10 also includes a biasing block 21 and a series of amp/stages 30, 32, and 34. Block 21 includes biasing devices 20, 22, 24 and 26 which provide self-biasing and self-referencing for amplifier 10. The series of three cascaded stages 30, 32, 34 perform level shifting and impart a small amount of linear gain to the signal on input rail 12. This permits extremely small voltage swings, which orignate at a level very close to the voltage of supply rail 18, to be sensed and shifted to approximately the center of the voltage range between voltage supply rail 18 and ground rail 17. This level to which cascaded stages 30, 32, 34 shift the signal on input rail 12 is set by biasing and referencing devices 20, 22, 24 and 26.

The three cascaded stages 30, 32, 34 are followed by a linear high gain inverting amplifier 16. Amplifier 16 produces at its output runner 19 voltage swings which extend from substantially the voltage of rail 18 to substantially the voltage of rail 17. Thus, a signal from memory cell and selection logic 36 may be sensed at input rail 12 and transferred with level shifting and linear amplification to output runner 19. All transistors in amplifier 10 are conventional field effect transistors. The substrate of all N channel transistors is coupled to ground rail 17.

Transistor pair 26 and transistor pair 24 are comprised of N channel devices. Pairs 26 and 24 are ratio devices. They divide the voltage difference between voltage supply rail 18 and ground rail 17 approximately in half, causing node 25 to have a reference voltage level of approximately one-half $V_{DD}$. This voltage level at node 25 is fed through cascaded stages 30, 32, 34 and is used to bias transistor pair 30a and transistors 32a and 34a. The bias thus applied to transistor pair 30 and transistors 32a and 34a causes them to act as substantially constant current sources.

Transistors 20 and 22 are P channel devices. They make the reference voltage at node 25 a function of the P channel threshold as well as the N channel threshold. This is desirable because the signal sensed at input rail 12 is a function of both thresholds and making the voltage at node 25 a function of both thresholds helps amplifier 10 track the swings of the input signal.

First cascaded stage 30 consists of transistor pairs 30a and 30b. The bias voltage at node 25 is applied to gates 30c of transistor pair 30a of first cascaded stage 30, causing transistor pair 30a to function as a substantially constant current source. Transistor pair 30b of first cascaded stage 30 has as its input at gates 30d the information contained in a memory cell of memory cells and selection logic 36 and coupled by input rail 12.

Transistor pair 30b functions as a substantially direct transfer gate for the signal sensed on input rail 12. First stage 30 imparts a small amount of loss due to the body effects of transistor pair 30b while transferring the input signal. However its primary function is level shifting. The output of stage 30, which appears at node 31, consists of the input signal swinging around the reference voltage which is fed through from node 25. Thus, first stage 30 functions as a level shifting direct transfer gate with a small loss.

Second cascaded stage 32 comprises transistors 32a and transistor pair 32b. The output of stage 30, which appears at node 31, is coupled to second cascaded stage 32 at gate 32c of transistor 32a. The coupling of point 31 to transistor 32a, along with the effects of biasing devices 20, 22, 24, and 26, cause transistor 32a to function as a substantially constant current source, as was the case with transistor pair 30a. Additionally, the coupling of node 31 to stage 32 causes node 33 to be at a voltage level of approximately one-half $V_{DD}$, the reference voltage level.

The gates 32d of transistor pair 32b are connected to power supply rail 18. Connecting transistor 32a and transistor pair 32b in this fashion causes stage 32 to function as a summing amplifier. The summing amplifier function of stage 32 imparts a small gain, in the range of 1.5 to 2, to the signal transferred by stage 30. The output of stage 32 appears at point 33 and is coupled to third cascaded stage 34.

Third cascaded stage 34 comprises transistors 34a and 34b. The gate 34c of transistor 34a is coupled to the output of stage 32 at node 33. This coupling applies the shifted and slightly amplified signal which was transferred from input rail 12 by transistor pair 30b. Transistor 34a is also a part of the same biasing scheme as transistors 30a and 32a. Thus, point 35 is biased at approximately one-half $V_{DD}$ and transistor 34a functions as a substantially constant current source.

The gate 34d of transistor 34b is coupled to input rail 12. Transistor 34b performs as a transfer device for the very small signal swing on input rail 12 which was also applied to gates 30d of first cascaded stage 30. The transfer through transistor 34b causes a small loss. However, the gain of transistor 34a more than compensates for this loss and injecting the input signal into third stage 34 in addition to first stage 30 helps to limit the amount of delay.

Stage 34 also does the remaining level shifting required to get the small swing of input rail 12 from its initial level very near to the $V_{DD}$ rail voltage to the optimum level of approximately one-half $V_{DD}$. Thus, the input signal is slightly amplified and approximately in the middle of the $V_{DD}$ range with very little delay between input rail 12 and node 35 where it is applied to the high gain inverting amplifier stage 16. This sensing and shifting of the signal at input rail 12 permits the design of memory cells with significantly smaller swing where the swing is very close to the voltage of supply rail 18, thus permitting faster operation in CMOS memories.

Stage 16 is a linear high gain inverting amplifier stage. It is comprised of a complementary pair of transistors, N channel transistor 16a and P channel transistor 16b. The output of third cascaded stage 34, which appears at node 35, is coupled to high gain inverting amplifier stage 16 at gate 16c of transistor 16a and at gate 16d of transistor 16b.

The signal at the input of high gain stage 16 is biased at substantially one-half $V_{DD}$ and has a gain in the range of approximately 1.5 to 2 imparted to it by first three cascaded stages 30, 32, 34. This signal, at node 35, is given an additional gain of approximately 15 by high gain stage 16. The output of stage 16 appears at output runner 19. This signal at output runner 19 swings from approximately ground rail 17 to voltage supply rail 18. Thus, input swings of about 200 millivolts or less on input rail 12 may be sensed by amplifier 10 and utilized as substantially rail to rail signals. Output runner 19 may be coupled to additional amplifier circuits, driver circuits and/or selection logic as desired.

What is claimed is:

1. A stable rail FET sense amplifier in a CMOS chip memory for sensing small output voltage swings from an output of said memory, said memory output voltage swings being at a level that is substantially or very close to the level of a voltage supply rail of said memory circuit, comprising means for shifting the voltage level of said memory voltage swings to substantially the center of the voltage range between the levels of said supply voltage rail and a reference voltage rail, said shifting means being comprised of a plurality of cascaded level shifting stages, an output of said memory being connected to the input of the first of said cascaded stages, each of said stages being capable of contributing to said shifting and each of said stages having a relatively small amount of gain or loss, and a bias reference means being coupled to said first stage for determining the level of said voltage range center; and high gain amplifier means coupled to the output of the last of said cascaded stages for providing a relatively high gain to the signal at said last stage output.

2. The stable rail sense amplifier of claim 1 wherein said first stage includes means for sensing input voltage swings of 200 millivolts or less.

3. The stable rail sense amplifier of claim 1 wherein the high gain amplifier means provides at its output voltage swings having substantially the voltage level of the voltage supply rail.

4. The stable rail sense amplifier of claim 1 in which said plurality of stages produces an overall linear gain factor in the range of 1.5 to 2.

5. The stable rail sense amplifier of claim 1 wherein said plurality of cascaded stages includes at least three stages and said third cascade stage has an independent input connected to said memory output for limiting the amount of delay of said voltage swings that appear at the output of said stages relative to said swings that appear at said memory output.

6. The stable rail sense amplifier of claim 1 wherein said high gain amplifier means is comprised of an N-channel and a P-channel transistor connected in standard CMOS circuit configuration and wherein said bias reference means is comprised of a voltage divider circuit including P-channel and N-channel transistors connected across said supply voltage and reference voltage rails additionally for compensating for the threshold voltages of said amplifier P-channel and N-channel transistors.

7. The stable rail sense amplifier of claim 1 wherein said high gain amplifier means is comprised of a complementary pair of transistors, namely an N-channel transistor and a P-channel transistor having their channels connected in series and their gate connected directly to said output of said level shifting stages.

8. A stable rail sense amplifier comprising:
    (a) a voltage supply rail and a reference voltage rail across which a supply voltage may be applied;
    (b) a level shifting circuit including three cascaded stages, each stage being comprised of at least two N-channel FET transistors connected to form a series circuit which is connected across said supply and reference rails, the junction of said at least two transistors of the first of said stages being connected to the gate of the second stage transistor which is connected to said reference rail, the junction of said at least two transistors of said second stage being connected to the gate of the third stage transistor which is connected to said reference rail, (c) a level-shifting-circuit input conductor means for connecting the gate of the first stage transistor which is connected to said supply voltage rail to a memory circuit output rail;

(d) a bias means for applying a bias voltage that is substantially half of said supply voltage to the gate of the first stage transistor which is connected to said reference voltage rail; and (e) a high gain amplifier having an input coupled to the junction between said at least two transistors of said third stage.

9. The stable rail sense amplifier of claim 8 wherein said level-shifting-circuit-input conductor means is additionally for connecting said memory circuit output rail to the gate of the third stage transistor which is connected to said supply voltage rail.

* * * * *